(12) United States Patent
Shen

(10) Patent No.: US 10,785,888 B1
(45) Date of Patent: Sep. 22, 2020

(54) AIR GUIDE COVER

(71) Applicant: Super Micro Computer Inc., San Jose, CA (US)

(72) Inventor: William Shen, San Jose, CA (US)

(73) Assignee: SUPER MICRO COMPUTER INC., San Jose, CA (US)

(*) Notice: Subject to any disclaimer, the term of this patent is extended or adjusted under 35 U.S.C. 154(b) by 75 days.

(21) Appl. No.: 16/296,624

(22) Filed: Mar. 8, 2019

(51) Int. Cl.
*G06F 1/20* (2006.01)
*H05K 7/20* (2006.01)

(52) U.S. Cl.
CPC .......... *H05K 7/20145* (2013.01); *G06F 1/20* (2013.01)

(58) Field of Classification Search
CPC . G06F 1/20; G06F 1/181; G06F 1/206; G06F 2200/201; H01L 23/4093; H01L 23/467; H05K 7/20145; H05K 5/03; H05K 7/20009; H05K 7/20163; F28F 13/06; F28F 2275/08; F28F 2275/085; F28F 3/12

USPC ............ 361/679.31, 679.46, 690, 704; 257/E23.086, E23.099; 165/104.34

See application file for complete search history.

(56) References Cited

U.S. PATENT DOCUMENTS

2016/0212880 A1* 7/2016 Wang .................... H01L 23/427

* cited by examiner

*Primary Examiner* — Mandeep S Buttar
(74) *Attorney, Agent, or Firm* — Chun-Ming Shih; HDLS IPR Services

(57) ABSTRACT

An air guide cover fixed on a motherboard having slot connectors and main coolers. The air guide cover includes an air guide body and a clip assembly. The air guide body covers the slot connectors correspondingly. The clip assembly has a first U-clip and a second U-clip, both of which connected to the air guide body. The first U-clip and the second U-clip are individually snapped and fixed to the clips of the slot connectors and the fixtures of the main coolers, respectively. In this way, the air guide cover can be fixed on the motherboard without using fasteners, like screws, such that savings in time and effort are achieved.

14 Claims, 6 Drawing Sheets

AIR GUIDE COVER

BACKGROUND OF THE INVENTION

Field of the Invention

The present invention relates to heat dissipation of electric devices and in particular to an air guide cover used for heat dissipation of a server.

Description of Prior Art

The electric device such as the server and the workstation have a motherboard equipped with lots of electronic components. These electronic components (e.g., the CPU, the expansion cards, and the other electronic components except the CPU and the expansion cards) will generate different amounts of heat during operation. Thus, it is necessary to design a heat dissipation mechanism especially for the main heat source (e.g., the CPU).

The existing heat dissipation structure designed especially for the main heat source is the air guide which directs a main amount of air from the fan to the main heat source and the remaining air to other heat sources such as the expansion cards and other electronic components to enhance the cooling effect on the main heat source.

However, the existing air guide needs additional fasteners, like screws, to be fixed on the motherboard, which is troublesome and inconvenient.

SUMMARY OF THE INVENTION

An objective of the present invention is to provide an air guide cover which can be snapped to the existing parts on the motherboard to achieve fastening without fasteners, like screws.

In order to achieve the above objective, the present invention provides an air guide cover fixed on a motherboard having slot connectors and main coolers disposed on a CPU. The air guide cover comprises at least one air guide body and at least one clip assembly. The at least one air guide body covers the slot connectors correspondingly. The at least one clip assembly has a first U-clip and a second U-clip, both of which are connected to the air guide body. The first U-clip and the second U-clip are individually snapped and fixed to a plurality of clips of the slot connectors and a plurality of fixtures of the main coolers, respectively.

Compared to the prior art, the present invention has the following effects. By means of the first U-clip and the second U-clip being individually snapped to the existing parts on the motherboard without fasteners, like screws, the air guide cover can be fixed on the motherboard such that savings in time and effort are achieved.

DETAILED DESCRIPTION OF THE INVENTION

The detailed description and technical details of the present invention will be explained below with reference to accompanying drawings. However, the accompanying drawings are only for reference and explanation, but not to limit the scope of the present invention.

Figure 1:
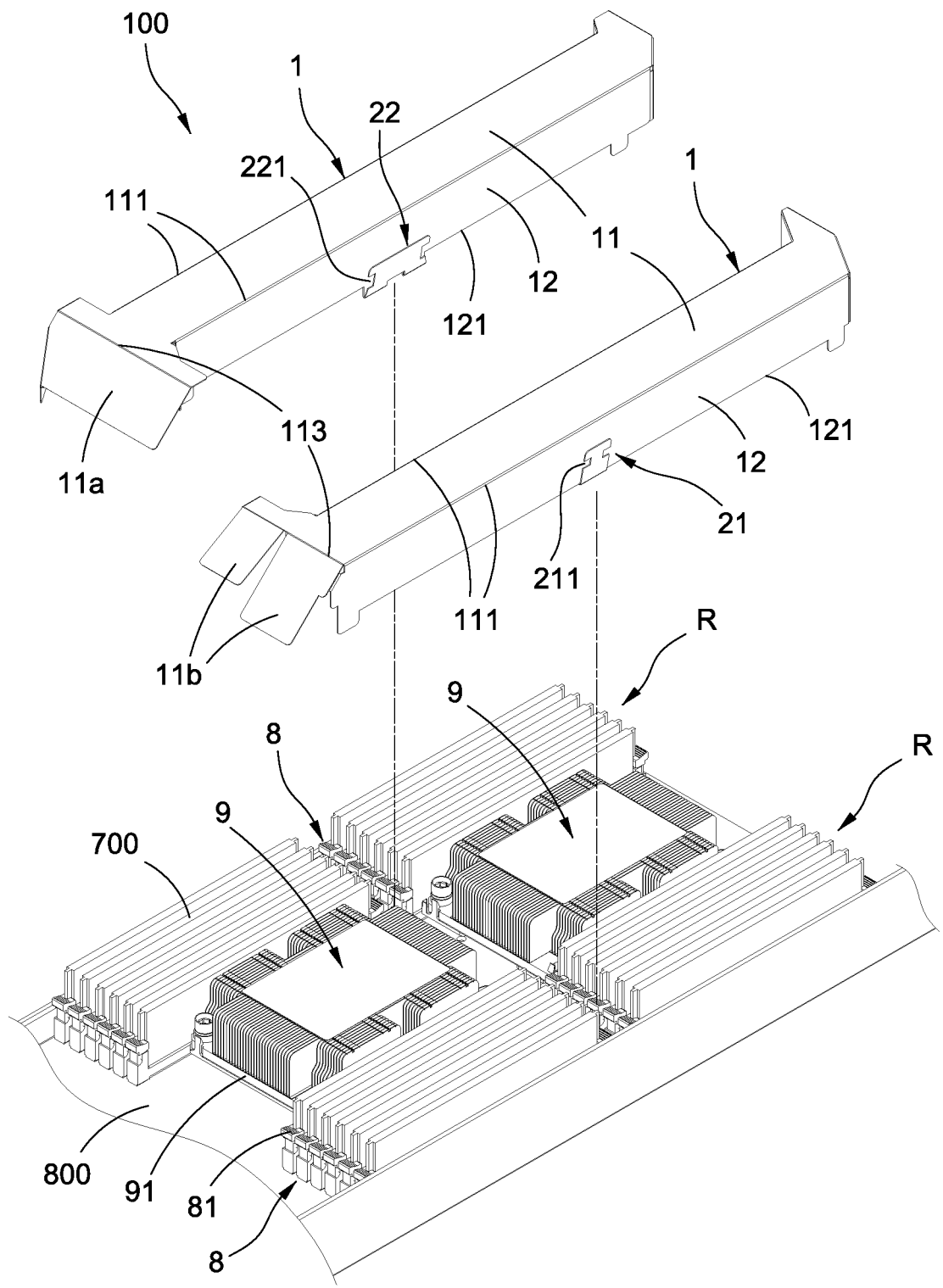
FIG. 1 is an exploded perspective view of the motherboard and the air guide cover of the present invention.
Figure 7:
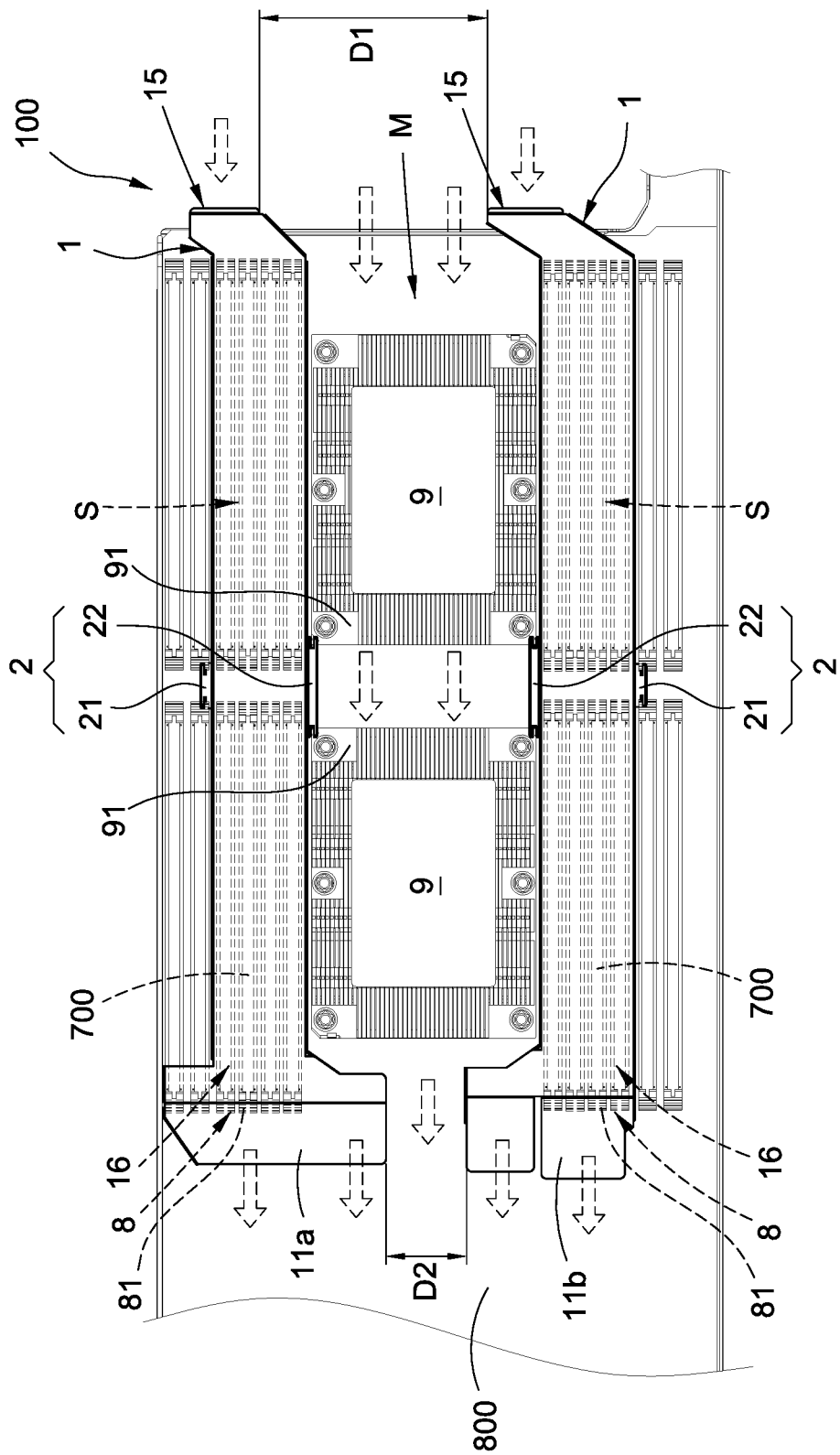
FIG. 7 is a top view according to FIG. 3 in a state of guiding air.

Please refer to FIGS. 1 and 7. The present invention provides an air guide cover which is mainly applied in a motherboard 800 of an electronic device such as a server and a workstation. The air guide cover 100 is used to guide the air outputted from a fan (not shown).

The motherboard 800 is electrically provided with many electronic devices; for example, the slot connectors 8, the main coolers 9, the computing devices (not shown) stacked underneath the main coolers 9, and other electronic components except for the above parts.

In the current embodiment, the DIMM socket (dual in-line memory module) is used as an example for explanation. The slot connector 8 has the following existing components. That is, a pair of clips 81, each having an ear 811 (refer to FIG. 5). The slot connector 8 is used for the plug-in of the expansion card 700 (e.g., the DIMM memory card). After the expansion card 700 is plugged, it is snapped to be positioned by the ears 811. The main cooler 9 has the following existing components: the fixtures 91 (refer to FIGS. 1 and 7). The main cooler 9 is fixed on the motherboard 800 through the fixtures 91 on which the heat dissipating part such as the cooling fins may be formed.

The numbers and the configurations of the slot connectors 8 and the main coolers 9 are not limited in the present invention. For example, at least two main coolers 9 can be disposed between plural slot connectors 8. The numbers and the configurations shown in FIG. 1 are used as an example for explanation in the current embodiment. That is, two adjacent main coolers 9 are disposed between two slot connector sets R. Each slot connector set R comprises plural rows of the slot connectors (not labeled). Each row of the slot connector sets R comprises two adjacent spaced slot connectors R located along the length direction of the slot connector 8. That is, there are two adjacent spaced slot connectors 8 disposed in a row.

As shown in FIGS. 1-4, the air guide cover 100 comprises at least one air guide body 1 and at least one clip assembly 2. That is, the air guide body 1 and the clip assembly 2 are one or more than one in number. In the current embodiment, two air guide bodies 1 and two clip assemblies 2 are used as an example for explanation and the two clip assemblies 2 are individually connected to the corresponding two air guide bodies 1.

Each air guide body 1 covers the corresponding slot connector set R such that each air guide body 1 covers plural rows of the slot connectors. Each row of the slot connectors 8 comprises two slot connectors 8.

The structure of the air guide body 1 is not limited in the present invention. In the current embodiment, the air guide body 1 having a top plate 11 and two side plates is used as an example for explanation. Also, two side plates 12 extend from two opposite edges 111 (refer to the long edges shown in FIG. 1) of the top plate 11 to be bent vertically downward in which the secondary air channel S encircled by the top plate 11 and the two side plates 12 is formed in the air guide body 1. Some or all of the slot connectors 8 in each slot connector set R are individually disposed inside the corresponding secondary air channel S of the air guide body 1. In addition, the secondary air channel S communicates between the air inlet 15 and the air outlet 16, both of which are individually disposed at two ends of the air guide body 1. Moreover, the two air guide bodies 1 are spaced in parallel on the motherboard 800 such that the primary air channel M is formed between two side plates 12 of the two respective adjacent air guide bodies 1. The two above-mentioned main coolers 9 are both disposed in the primary air channel M.

The clip assembly 2 has a first U-clip 21 and a second U-clip 22, both of which are connected to the air guide body 1; the first U-clip 21 and the second U-clip 22 are individually snapped and fixed to the clips 81 of the slot connectors 8 and the fixtures 91 of the main coolers 9, respectively.

The structures of the first U-clip 21 and the second U-clip 22 are not limited in the present invention. In the current embodiment, the following structures are used as an example for explanation. The first U-clip 21 and the second U-clip 22 are individually connected to two side plates 12 of the air guide body 1. Preferably, the first U-clip 21 and the second U-clip 22 are integrally formed and extend individually from the bottom edges 121 (refer to FIG. 1) of the two side plates 12 to be bent upward, bent from the bottom edges 121 toward the top plate 11. The first U-clip 21 and the second U-clip 22 can be bent into or out of the air guide body 1, not limited in the present invention. Being bent out of the air guide body 1 is used as an example for explanation in the current embodiment. In this way, it is easy for the user to install/uninstall the air guide cover 100 by poking the clip assembly 2 from the outside of the air guide body 1.

Figure 6:
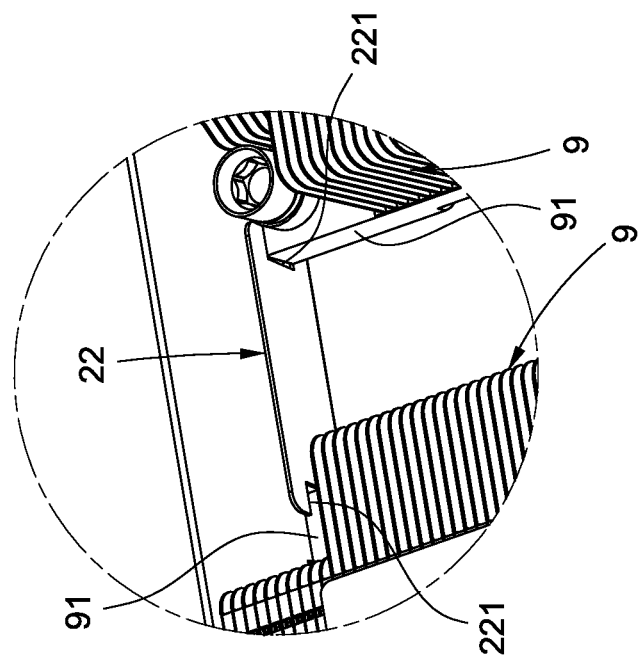
FIG. 6 is a local enlarged view of the air guide cover of the present invention fixed to the motherboard through the second U-clip.
Figure 5:
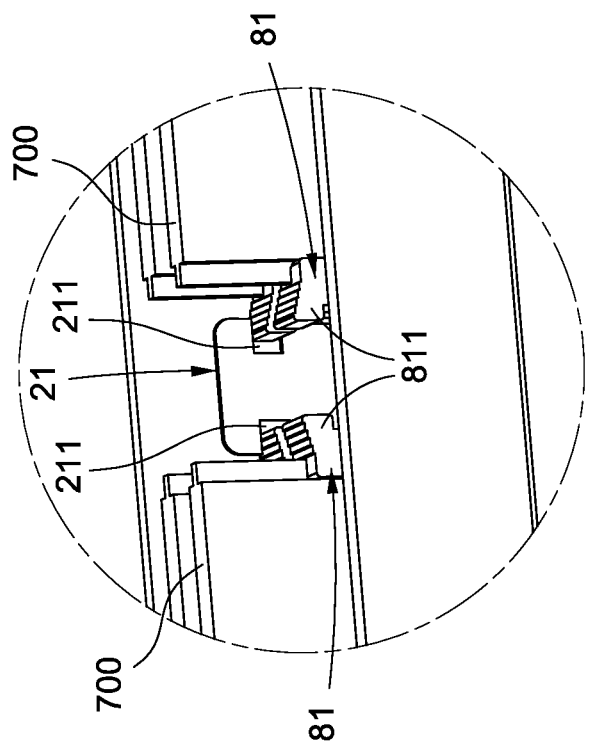
FIG. 5 is a local enlarged view of the air guide cover of the present invention fixed to the motherboard through the first U-clip.

As shown in FIGS. 5 and 6, the first U-clip 21 has two first cuts 211 individually disposed at two opposite sides thereof and the first U-clip 21 is located between the respective clips 81 of two slot connectors 8 disposed in line such that the two first cuts 211 are individually snapped to and fixed to two ears 811 of the clips 81 correspondingly. That is, the two ears 811 are individually engaged with the two first cuts 211. The second U-clip 22 has two second cuts 221 individually disposed at two opposite sides thereof and the second U-clip 22 is located between the respective fixtures 91 of two adjacent main coolers 9 such that the two second cuts 221 are individually snapped to and fixed to the sides of the fixtures 91. That is, the sides of the fixtures 91 are individually engaged with the two second cuts 221. Therefore, the air guide cover 100 can be fixed on the motherboard 800 without fasteners, like screws, and savings in time and effort can be achieved. Moreover, the air guide cover 100 is snapped and fixed to the existing parts (e.g., the clips 81 and the fixtures 91) on the motherboard 800, which does not require any structural modification of the motherboard 800.

When the air guide cover 100 needs to be uninstalled, the user just pokes the first U-clip 21 and the second U-clip 22 toward the side plates 12 to easily release the air guide cover 100.

As shown in FIG. 7, when the first U-clip 21 and the second U-clip 22 are snapped to the ears 811 of the clips 81 and the sides of the fixture 91, respectively, the two air guide bodies 1 are then fixed at the preset positions on the motherboard 800. After that, when the fan (not shown) is disposed corresponding to the air inlet 15 of the air guide cover 100, a main amount of air from the fan is directed through the primary air channel M such that the heat generated by the main heat source such as the CPU is transferred through the main coolers 9 and the main amount of air and the remaining air from the fan is directed through the secondary air channel S such that the heat generated by other heat sources such as the electronic components on the expansion cards 700 is transferred through the remaining air.

Figure 2:
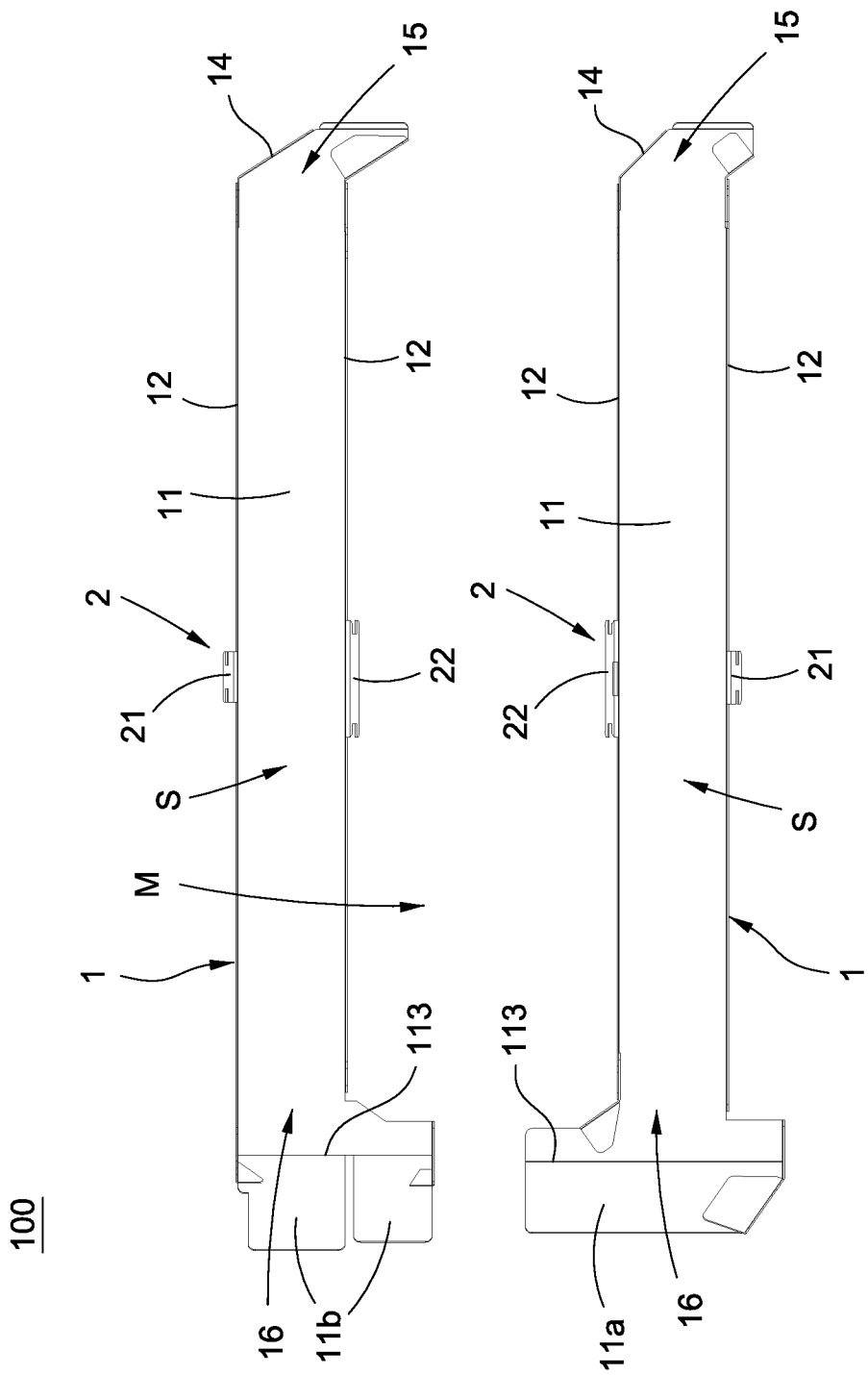
FIG. 2 is a bottom schematic view of the air guide cover of the present invention.
Figure 3:
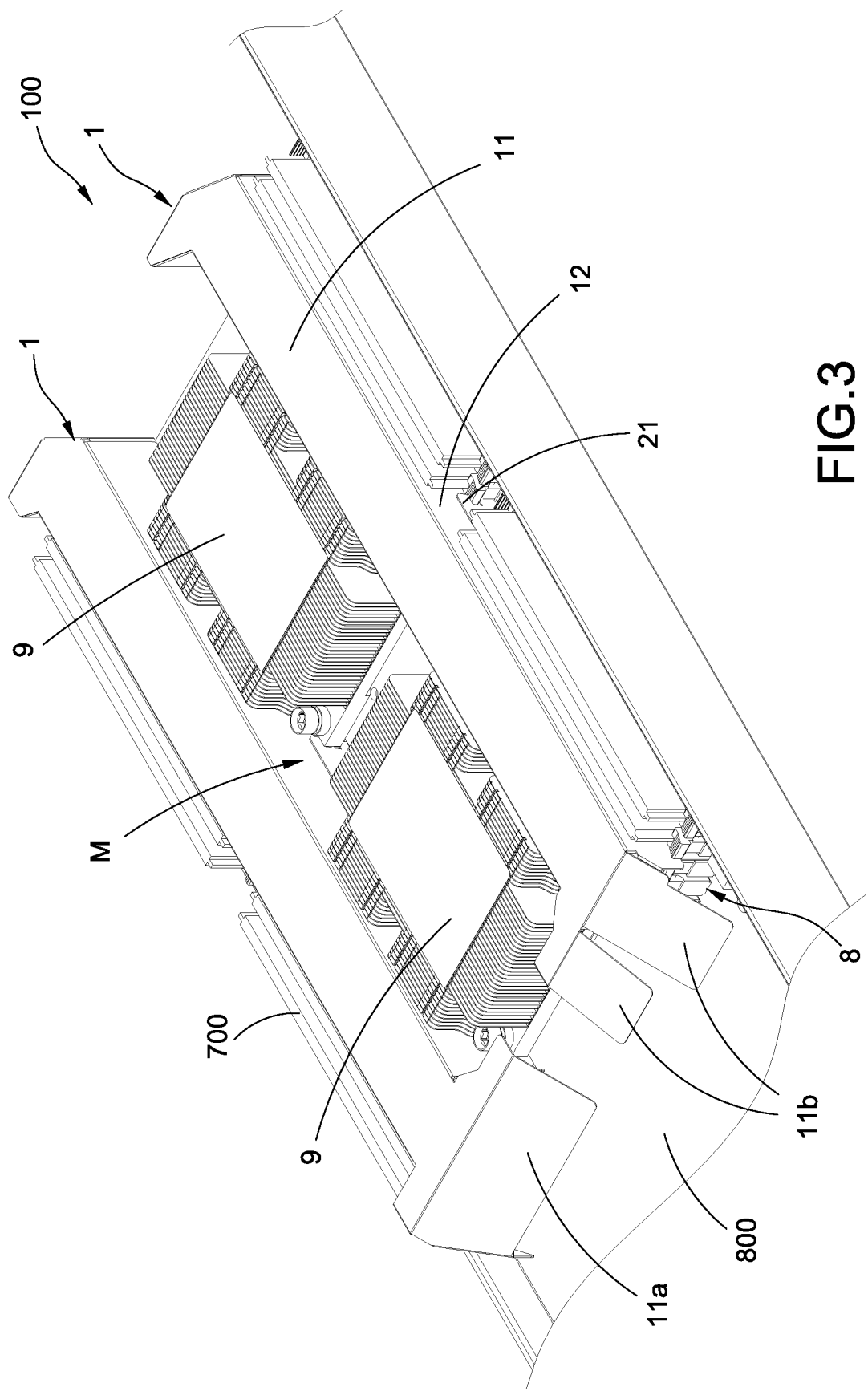
FIG. 3 is a perspective assembled view according to FIG. 1.
Figure 4:
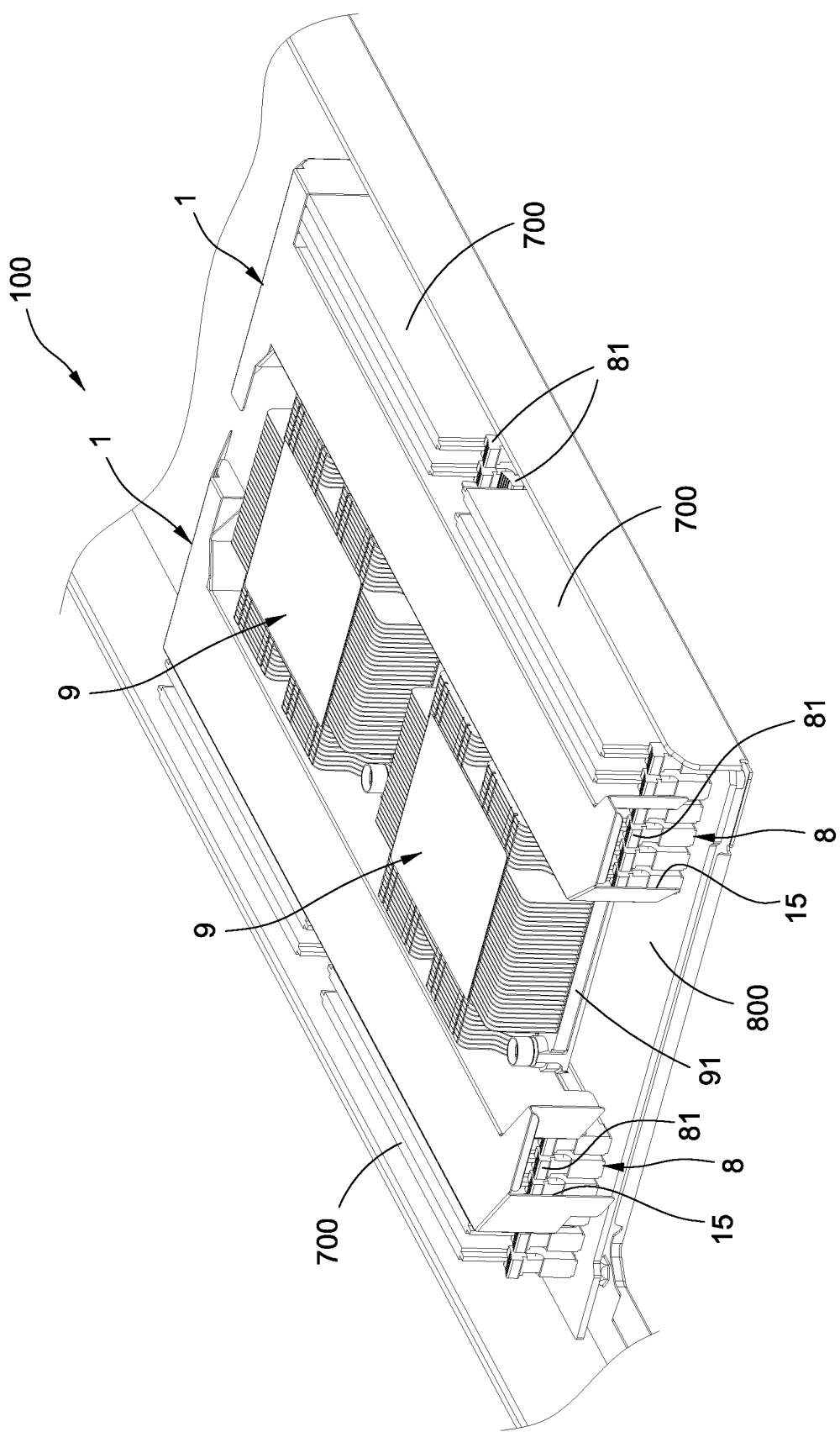
FIG. 4 is another view of FIG. 3 after a 180-degree rotation.

It must be stated that, as shown in FIG. 2, the air inlet 15 of each air guide body 1 is bent and staggered with respect to the secondary air channel S such that the air inlet 15 is not aligned with the secondary air channel S. As a result, this design prevents the above-mentioned remaining air from flowing into the secondary air channel S smoothly and consequently the air flowing into the primary air channel M is increased. The staggered structure of the air inlet 15 is not limited in the present invention. For example, the air inlet 15 can be bent and staggered. Preferably, a bent portion 14 can be added to the air guide body 1 such that the air inlet 15 is staggered with respect to the secondary air channel S by means of the bent portion 14.

As shown in FIG. 7, to improve the heat dissipation efficiency of the main coolers 9 in the primary air channel M, the second distance D2 between two air outlets 16 is designed to be less than the first distance D1 between two air inlets 15 such that the air flow rate in the primary air channel M may change to enhance heat dissipation. The present invention does not limit how to make the second distance D2 less than the first distance D1. In the current embodiment, the dispositions of the baffles 11a and 11b are used as an example for explanation below.

As shown in FIGS. 1, 2, and 7, two air guide bodies 1 individually have the baffle 11a and the baffle 11b corresponding to the respective air outlets 16. The baffles 11a and 11b protrude into the primary air channel M such that the second distance D2 between two baffles 11a and 11b in the primary air channel M is less than the first distance D1 between two air inlets 15.

In particular, the top plate 11 of the air guide body 1 has an edge 113 (refer to the short edge shown in FIG. 1) corresponding to the air outlet 16. The top plate 11 extends from the edge 113 to incline downward to form the baffles 11a and 11b as the blocks corresponding to the air outlet 16. In this way, the air from the air outlet 16 can be presses and guided downward to other electronic devices on the motherboard 800. The above-mentioned electronic devices are electrically disposed on the left portion of the motherboard 800 in FIG. 7 but not shown. In detail, the above-mentioned remaining air which has performed heat exchange with the electronic devices on the expansion cards 700 is outputted from the air outlet 16 and is guided downward to repeat heat exchange with other electronic devices by means of the baffles 11a and 11b, which achieves efficient usage of the remaining air. Moreover, there could be two baffles 11b with different tilted angles to guide the remaining air to other electronic devices at different distances.

The baffles 11a and 11b can further protrude integrally along the length direction of the edge 113 to extend a projection length such that the baffles 11a and 11b can penetrate into the primary air channel M by means of the projection length. Consequently, the second distance D2 between two air outlets 16 is shortened to be less than the first distance D1.

It must be stated that, the air guide body 1 and the clip assembly 2 are made of Mylar and are integrally formed. Thus, they are quite light and electrically insulated from the electronic devices.

In other embodiments not shown in the drawings, the above-mentioned first U-clip 21 and the second U-clip 22 can be bent into the air guide body 1 and the bent first U-clip 21 and the bent second U-clip 22 inside the air guide body 1 still can be snapped and fixed to the clips 81 correspondingly in the air guide body 1. Further, the numbers of the air guide bodies 1 and the clip assemblies 2 are not limited to two; there could be only one air guide body 1 and only one clip assembly 2. Provided that the air guide body 1 is spaced adjacent to any wall body (i.e., one slot connector set R in FIG. 1 is replaced with the above-mentioned wall body), the above-mentioned primary air channel M can be formed in the space between them. Furthermore, even though only one air guide body 1 and only one clip assembly 2 are disposed, the air guide cover 100 still can be fixed by means of the first U-clip 21 and the second U-clip 22 being individually snapped to the clips 81 and the fixtures 91.

In summary, the air guide cover of the present invention can achieve the expected objectives and overcome the disadvantages of the existing techniques. Also, it is novel, useful, and non-obvious to be patentable. Please examine the application carefully and grant it as a formal patent for protecting the rights of the inventor.

The embodiments disclosed in the above description are only preferred embodiments of the present invention, but not to limit the scope of the present invention. The scope of the present invention should be embraced by the accompanying claims and includes all the equivalent modifications and not be limited to the previous description.

What is claimed is:

1. An air guide cover fixed on a motherboard having a plurality of slot connectors and a plurality of main coolers disposed on a CPU, the air guide cover comprising: at least one air guide body (1) covering the slot connectors correspondingly; and at least one clip assembly having a first U-clip and a second U-clip, both of which are connected to the air guide body, wherein the first U-clip and the second U-clip are individually snapped and fixed to a plurality of clips of the slot connectors and a plurality of fixtures of the main coolers, respectively; wherein the first U-clip is located between the respective clips of two of the slot connectors disposed in line and has two first cuts, wherein the two first cuts are individually snapped to and fixed to two ears of the clips correspondingly.

2. The air guide cover according to claim 1, wherein the at least one air guide body (1) and the at least one clip assembly (2) are two in number, wherein the two clip assemblies (2) are individually connected to the two air guide bodies (1) correspondingly, wherein the two air guide bodies (1) are spaced in parallel on the motherboard (800), wherein a primary air channel (M) is formed between the two air guide bodies (1), wherein the main coolers (9) are disposed in the primary air channel (M).

3. The air guide cover according to claim 2, wherein each of the two air guide bodies (1) has an air inlet (15), an air outlet (16), and a baffle (11*a*,11*b*) corresponding to the air outlet (16), wherein each of the baffles (11*a*, 11*b*) protrudes into the primary air channel (M), wherein the distance (D2) between the baffles (11*a*, 11*b*) is less than the distance (D1) between the two air inlets (15) in the primary air channel (M).

4. The air guide cover according to claim 1, wherein a secondary air channel (S) is formed in each of the at least one air guide body (1), wherein each of the at least one air guide body (1) has two end openings (15, 16), wherein the secondary air channel (S) interconnects the two end openings (15, 16).

5. The air guide cover according to claim 4, wherein the two end openings (15, 16) of each of the at least one air guide body (1) includes an air inlet (15), wherein the air inlet (15) is bent and staggered with respect to the secondary air channel (S), wherein the air inlet (15) is not aligned with the secondary air channel (S).

6. The air guide cover according to claim 4, wherein each of the at least one air guide body (1) has a top plate (11), wherein the two end openings (15, 16) of each of the at least one air guide body (1) includes an air outlet (16), wherein the top plate (11) extends from an edge (113) corresponding to the air outlet (16) to incline downward to form at least one baffle (11*a*/11*b*), wherein the at least one baffle (11*a*/11*b*) presses and guides the air outputted from the air outlet (16) downward to the motherboard (800).

7. The air guide cover according to claim 2, wherein a secondary air channel (S) is formed in each of the at least one air guide body (1), wherein each of the at least one air guide body (1) has two end openings (15, 16), wherein the secondary air channel (S) interconnects the two end openings (15, 16).

8. The air guide cover according to claim 7, wherein the two end openings (15, 16) of each of the at least one air guide body (1) includes an air inlet (15), wherein the air inlet (15) is bent and staggered with respect to the secondary air channel (S), wherein the air inlet (15) is not aligned with the secondary air channel (S).

9. The air guide cover according to claim 7, wherein each of the at least one air guide body (1) has a top plate (11), wherein the two end openings (15, 16) of each of the at least one air guide body (1) includes an air outlet (16), wherein the top plate (11) extends from an edge (113) corresponding to the air outlet (16) to incline downward to form at least one baffle (11*a*/11*b*), wherein the at least one baffle (11*a*/11*b*) presses and guides the air outputted from the air outlet (16) downward to the motherboard (800).

10. The air guide cover according to claim 1, wherein the at least one air guide body (1) and the at least one clip assembly (2) are made of Mylar and are integrally formed.

11. The air guide cover according to claim 1, wherein the second U-clip (22) is located between the respective fixtures (91) of two adjacent main coolers (9) and has two second cuts (221), wherein the two second cuts (221) are individually snapped to and fixed to sides of the fixtures (91) correspondingly.

12. The air guide cover according to claim 1, wherein each of the at least one air guide body (1) has a top plate (11) and two side plates (12) extending from two opposite edges (111) of the top plate (11) to be bent vertically downward, wherein the first U-clip (21) and the second U-clip (22) are individually connected to the two side plates (12) of each of the at least one air guide body (1).

13. The air guide cover according to claim 12, wherein the first U-clip (21) and the second U-clip (22) are integrally formed and extend individually from bottom edges (121) of the two side plates (12) to be bent upward.

14. An air guide cover fixed on a motherboard having a plurality of slot connectors and a plurality of main coolers disposed on a CPU, the air guide cover comprising: at least one air guide body covering the slot correspondingly; and at least one clip assembly having a first U-clip and a second U-clip, both of which are connected to the air guide body, wherein the first U-clip and the second U-clip are individually snapped and fixed to a plurality of clips of the slot connectors and a plurality of fixtures of the main coolers, respectively; wherein the second U-clip is located between the respective fixtures of two adjacent main coolers and has two second cuts wherein the two second cuts are individually snapped to and fixed to sides of the fixtures correspondingly.

\* \* \* \* \*